United States Patent
Wang

(10) Patent No.: US 11,276,717 B2
(45) Date of Patent: Mar. 15, 2022

(54) MULTISPECTRAL IMAGE SENSOR AND MANUFACTURING METHOD THEREOF

(71) Applicants: SHANGHAI IC R&D CENTER CO., LTD., Shanghai (CN); CHENGDU IMAGE DESIGN TECHNOLOGY CO. LTD., Chengdu (CN)

(72) Inventor: Yong Wang, Shanghai (CN)

(73) Assignees: SHANGHAI IC R&D CENTER CO., LTD., Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 16/486,153

(22) PCT Filed: Jun. 6, 2017

(86) PCT No.: PCT/CN2017/087279
§ 371 (c)(1),
(2) Date: Aug. 15, 2019

(87) PCT Pub. No.: WO2018/149056
PCT Pub. Date: Aug. 23, 2018

(65) Prior Publication Data
US 2019/0371843 A1   Dec. 5, 2019

(30) Foreign Application Priority Data
Feb. 15, 2017   (CN) .......................... 201710081904.5

(51) Int. Cl.
*H01L 27/146* (2006.01)

(52) U.S. Cl.
CPC .. *H01L 27/14605* (2013.01); *H01L 27/14685* (2013.01); *H01L 27/14627* (2013.01); *H01L 27/14636* (2013.01)

(58) Field of Classification Search
None
See application file for complete search history.

(56) References Cited

U.S. PATENT DOCUMENTS

| 4,339,514 A | 7/1982 | Biber | |
|---|---|---|---|
| 2016/0035770 A1* | 2/2016 | Ahn | H01L 27/14627 257/432 |
| 2016/0380032 A1* | 12/2016 | Park | H01L 51/44 257/40 |

FOREIGN PATENT DOCUMENTS

CN   104977278 A1   10/2015

\* cited by examiner

*Primary Examiner* — Daniel Whalen
(74) *Attorney, Agent, or Firm* — Tianchen LLC.; Yuan R. Li; Yi Fan Yin

(57) ABSTRACT

The present disclosure refers to a multispectral image sensor and a manufacturing method thereof. The multispectral image sensor comprises a front-end structure used for photoelectric conversion and processing, and a pixel layer provided on the front-end structure. The pixel layer comprises N pixel units, and N≥4, the pixel units are arranged in a plurality of arrays, a photosensitive wavelength of each pixel unit in each array is different. Whereby, multispectrals can be detected simultaneously, and therefore the efficiency is improved, costs are reduced, and miniaturization is achieved.

5 Claims, 5 Drawing Sheets

--- Prior Art ---

MULTISPECTRAL IMAGE SENSOR AND MANUFACTURING METHOD THEREOF

CROSS-REFERENCE TO RELATED APPLICATION

This application claims priority of International Patent Application Serial No. PCT/CN2017/087279, filed Jun. 6, 2017, which is related to and claims priority of Chinese patent application Serial No. 201710081904.5, filed Feb. 15, 2017 The entirety of each of the above-mentioned patent applications is hereby incorporated herein by reference and made a part of this specification.

TECHNICAL FIELD

The present disclosure relates to the technical field of integrated circuits, in particular to a multispectral image sensor and a manufacturing method thereof.

BACKGROUND

Spectral analysis is one of the most widely used methods in scientific work and is usually used for solving the basic problems and application problems in physics, chemistry, biology, geology, geophysical, medicine and other disciplines. This invention discloses a spectral analysis technology which is contained in various fields so that the whole science progress is comprehensively guaranteed, and the production and living of people are further influenced.

Spectral detection technology is a basis for spectral analysis and is widely used in scientific research and production. With the development and improvement of scientific research and production technologies, the spectral detection technology also faces a lot of requirements and challenges.

Please refer to FIG. 1, FIG. 1 is a schematic diagram of a spectral detection device in the prior art. As shown in FIG. 1, the spectral detection device in the prior art is characterized in that a light source is arranged in a closed body case, a camera 2 and a light gathering device 3 are arranged above an observation window of an optical filter switching unit 4 through a bracket 1, for acquiring gray level images of samples in the optical filter, and switching the optical filters of different spectrums through the optical filter switching unit 4 so as to detect the samples.

However, the spectral detection method in the prior art is relatively crude and has a large limitation, the spectral detection of different wavelengths needs to be realized by switching filters without stopping, and efficiency is very low; in addition, due to the fact that the size of the optical filter switching unit is limited, only 20 optical filters can be used to switch, so that the spectrum detection range is restricted.

SUMMARY

The present invention provides a multi-spectral image sensor and a manufacturing method thereof and is used for improving the spectrum detection mechanism and improving the detection efficiency.

In order to solve the problem, the present disclosure provides a multi-spectral image sensor which comprises:
a front-end structure for performing photoelectric conversion and processing;
a pixel layer arranged on the front-end structure;
wherein, the pixel layer has N pixel units, N≥4, the pixel units are arranged in a plurality of arrays, the photosensitive wavelengths of each pixel unit in each array are different.

Preferably, the pixel units are arranged in a plurality of repeating arrays.

Preferably, the photosensitive wavelengths of the pixel units in each array are sequentially increased.

Preferably, the photosensitive half-wavelength width range of the pixel unit of each array is from $\lambda_i/2-20$ nm to $\lambda_i/2+20$ nm, wherein $\lambda_i$ is the set photosensitive wavelength of the $i^{th}$ pixel unit, and $1 \leq i \leq N$.

Preferably, the front-end structure has metal interconnects, and each pixel unit is arranged between the adjacent metal interconnects.

Preferably, further comprising: a micro-lens layer disposed on the pixel layer.

Preferably, further comprising: a bonding pad region disposed at the edge of the front-end structure.

In order to solve the problem, the present disclosure also provides a method for manufacturing a multispectral image sensor, comprises:
providing a front-end structure for performing photoelectric conversion and processing;
forming a pixel layer on the front-end structure, wherein, the pixel layer has N pixel units, N≥4, the pixel units are arranged in a plurality of arrays, the photosensitive wavelengths of each pixel unit in each array are different.

Preferably, the step of forming the pixel layer on the front-end structure comprises:
coating a first material layer on the front-end structure, to cover a metal interconnect on the front-end structure;
coating a first photosensitive material layer on the first material layer, and forming a first pixel unit through photolith;
coating a $k^{th}$ photosensitive material layer on the first material layer, and forming a $k^{th}$ pixel unit through photolith;
coating the first material layer with the $N^{th}$ photosensitive material layer, and forming an $N^{th}$ pixel unit through photolith;
wherein each pixel unit is different from its adjacent pixel unit, the photosensitive wavelengths of the first photosensitive material layer to the $N^{th}$ photosensitive material layer are different, and $1<k<N$.

Preferably, the first pixel unit to the $N^{th}$ pixel unit are arranged in an array in sequence.

Preferably, the photosensitive half-wavelength width range of the first photosensitive material layer to the $N^{th}$ photosensitive material layer is from $\lambda_i/2-20$ nm to $\lambda_i/2+20$ nm, wherein $\lambda_i$ is the set photosensitive wavelength of the $i^{th}$ photosensitive material layer, and $1 \leq i \leq N$.

Preferably, each pixel unit is formed between adjacent metal interconnects.

Preferably, after the pixel layer is formed on the front-end structure, the method further comprises:
forming a second material layer to cover the pixel layer and the first material layer;
forming a lens material layer on the second material layer which is on a region of the pixel layer; through a photolith process of the lens material layer to form a micro-lens layer;
forming a third material layer to cover the micro-lens layer and the second material layer;

exposing the edge region of the front-end structure through photolith and etching processes, to form a bonding pad region; and removing the third material layer.

Compared with the prior art, the multi-spectral image sensor and a manufacturing method thereof according to the present disclosure have the following advantages:

①. High Expandability

By adopting the multi-spectral image sensor and the manufacturing method thereof, the multi-spectral image sensor is not limited to an optical filter switching unit, a plurality of photosensitive materials with different wavelengths can be arranged according to requirements, so that the detection of hundreds or even more of the spectrums can be realized.

②. Fast and Efficient

By adopting the multi-spectral image sensor and the manufacturing method thereof, the multi-spectral image sensor can be compatible with dozens of hundreds or even more of spectrums, and multispectrals can be detected at the same time without switching the optical filter. In the assembly line detection operation, the speed of the assembly line can be increased, and the practical application efficiency can be greatly improved.

③. Small in Size and Low in Cost

According to the spectrum detection device, an optical filter switching unit can be omitted, so that the size of the overall spectrum detection device is reduced, and the cost is reduced.

④. Wide Application Range

The multi-spectral image sensor and the manufacturing method thereof can be compatible with dozens of hundreds or even more of spectrums and can be applied to various occasions. And in some occasions, such as a small closed space, the optical filter switching unit is difficult to be accommodated in the small closed space, the spectrum detection device provided by the present disclosure has the characteristics of being small and capable of being suitable for such occasions.

DETAILED DESCRIPTION

The multi-spectral image sensor and the manufacturing method thereof are further described in detail with reference to the accompanying drawings and the specific embodiments. Advantages and features of the present disclosure will become apparent from the following description and claims. It should be noted that the drawings are in a very simplified form and are only used for conveniently and clearly illustrating the objectives of the embodiments of the present disclosure.

Figure 1:
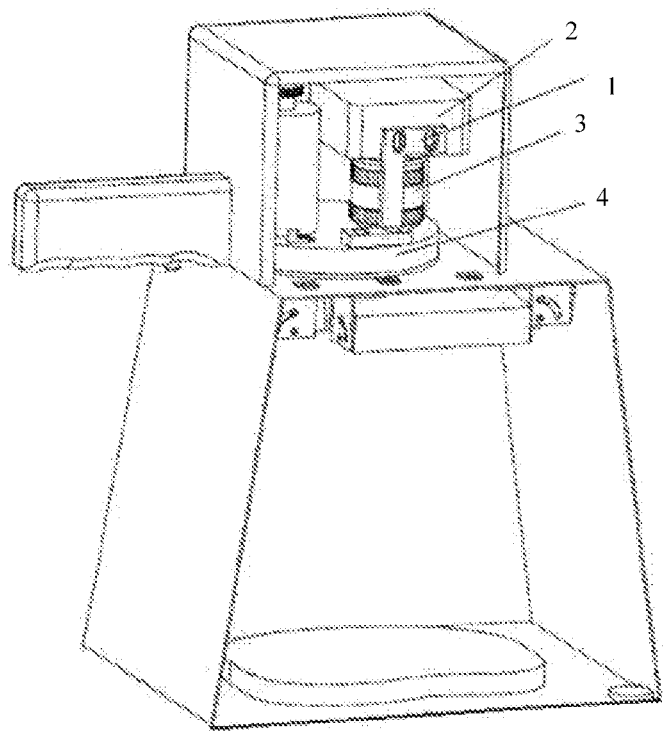
FIG. 1 is a schematic diagram of a spectrum detection device in the prior art
Figure 2:
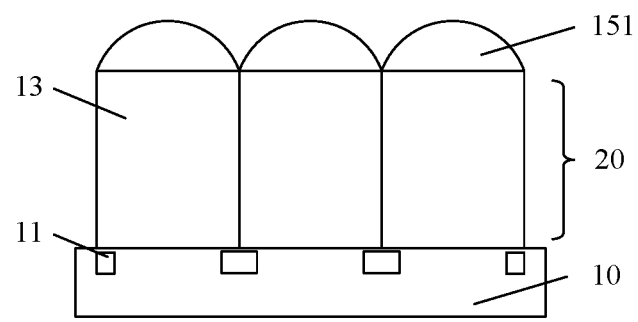
FIG. 2 is a schematic diagram of a multi-spectral image sensor according to an embodiment of the present disclosure

Referring to FIG. 2, FIG. 2 is a schematic diagram of a multi-spectral image sensor according to an embodiment of the present disclosure. As shown in FIG. 2, the multi-spectral image sensor comprises a front-end structure 10 and a pixel layer 20 arranged on the front-end structure 10; wherein the front-end structure 10 is used for carrying out photoelectric conversion and processing; the pixel layer 20 has N pixel units 13, the N pixel units 13 are arranged in a plurality of arrays, each pixel unit 13 in each array has a different photosensitive wavelength.

In one embodiment of the present disclosure, the front-end structure 10 may include, for example, a substrate, and wherein a sensor layer arranged in the substrate is provided for performing the photoelectric conversion. A photosensitive element (a photoelectric conversion component) is arranged in the sensor layer and is used for converting incident light into electrons to form electric signals.

A metal interconnect 11 can also be formed on the substrate, and the metal interconnect 11 is used for transmitting the photoelectric converted electric signal of the sensor layer to the peripheral circuit for processing; a bonding pad region can be arranged at the edge of the front-end structure 10 so as to serve as a subsequent packaging and wire bonding; the front-end structure 10 can be selected according to the prior art, which is not specifically described in the present disclosure.

Further, a micro-lens layer 151 is further included above the pixel layer 20 to achieve condensation, and the micro-lens layer 151 can also adopt an existing structure.

Figure 3:
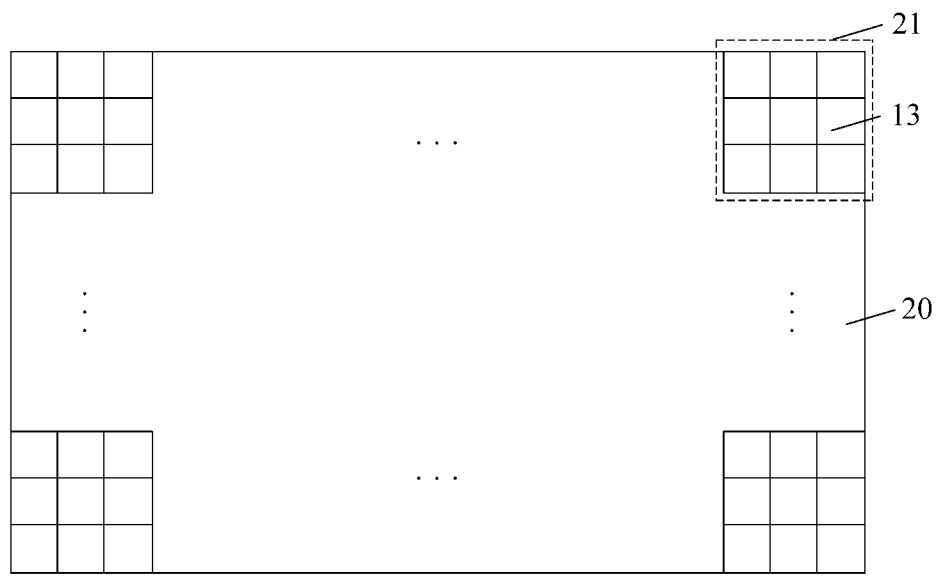
FIG. 3 is a top view of a multi-spectral image sensor according to an embodiment of the present disclosure

Referring to FIG. 3, the pixel units 13 are arranged in a plurality of repeating arrays 21, and the photosensitive wavelengths of each pixel unit 13 in each array 21 are different. The front-end structure 10 is provided with a metal interconnect 11, and each pixel unit 13 is arranged between adjacent metal interconnects 11, so that light transmission is facilitated.

Figure 4:
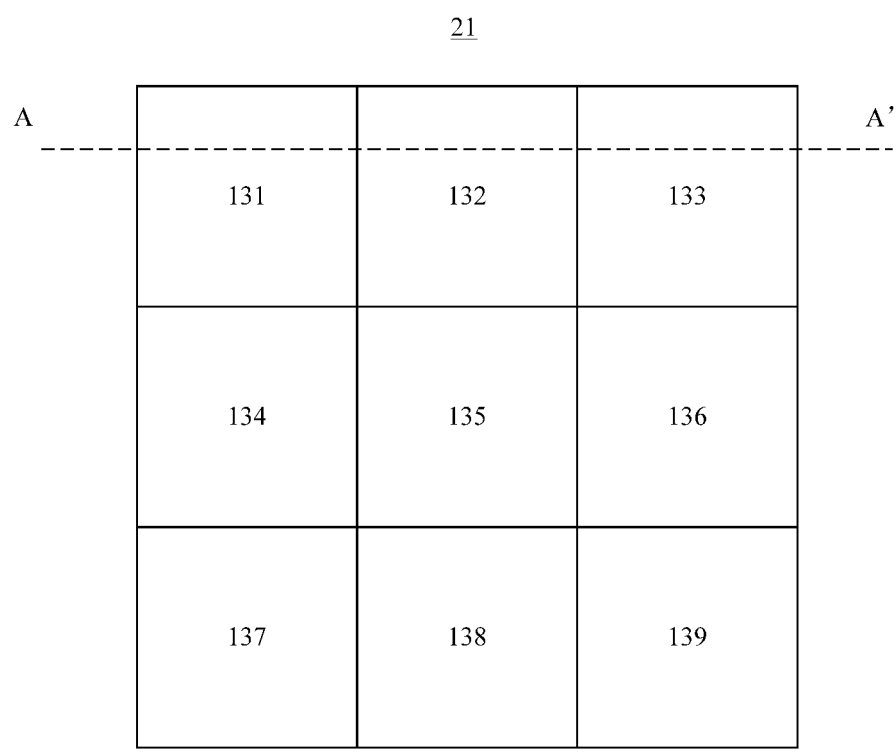
FIG. 4 is a schematic diagram of an array of a multi-spectral image sensor according to an embodiment of the present disclosure

For example, FIG. 4 shows an array 21, the array 21 is being a 3*3 array (i.e., 3 rows and 3 columns). The nine-pixel units 13 in the array 21 are respectively provided with photosensitive materials with different wavelengths. If the nine-pixel units are marked as 131,132,133, 134,135,136, 137,138, 139 respectively, the photosensitive wavelength corresponding to each pixel unit 13 is $\lambda_1, \lambda_2, \lambda_3, \lambda_4, \lambda_5, \lambda_6, \lambda_7, \lambda_8$, and $\lambda_9$, so that gray images of nine different spectrums can be collected at the same time. Through the later algorithm processing (such as using the processor to extract the pixel of the chip, etc.), the nine different spectrums can be detected simultaneously.

In order to facilitate production and post-processes, the photosensitive wavelengths of the pixel units 13 in each array 21 are sequentially increased. Preferably, the photosensitive half-wavelength width range of each pixel unit 13 in each array 21 is from $\lambda_i/2-20$ nm to $\lambda_i/2+20$ nm, wherein $\lambda_i$ is the set photosensitive wavelength of the $i^{th}$ pixel unit, and $1 \le i \le N$. In the invention, depending on the photosensitive material that forms the pixel unit 13, an arbitrary range of photosensitive wavelengths can be set, for example, can be 10-2000 nm, and definitely can be other ranges according to actual requirements, such as greater than 2000 nm and the like. For example, the photosensitive wavelengths of the nine-pixel units 13 can be 450 nm, 500 nm, 550 nm, 600 nm, 660 nm, 730 nm, 800 nm, 850 nm, 950 nm respectively.

Please refer to FIG. 3, in the nine kinds of spectral detection are realized in a multi-spectral image sensor with the resolution ratio of 1080p, namely a multi-spectral image sensor based on the resolution of 1920*1080, the pixel layer 20 comprises a plurality of repeated arrays 21, for example, the array can be a 3*3 array as shown in FIG. 4, and each row has 640 columns and totally 360 rows. The array 21 can be respectively filled with photosensitive materials with different wavelengths through specific processing modes to complete (see the following manufacturing method in detail).

The example shown above is a 3*3 array. It is understandable that arrays can also have other forms, such as 4*4 array, or rectangular array. In addition, the array can further comprise a plurality of pixel layers 20 which are arranged in parallel, so that the size is expanded, and the photosensitive wavelength range in each pixel layer 20 can also be different, so that detection of hundreds or even more types of spectrums can be obtained.

By means of the multi-spectral image sensor, the spectrum detection device can be obtained. Those skilled in the art can directly obtain a spectrum detection device based on the multispectral image sensor provided by the present disclosure.

The invention further provides a manufacturing method of the multi-spectral image sensor; the manufacturing method comprises the following steps:

Step S1: providing a front-end structure, wherein the front-end structure is used for carrying out photoelectric conversion and processing;

Step S2: forming a pixel layer on the front-end structure.

Wherein the pixel layer has N pixel units, and N is larger than or equal to 4, the N pixel units are arranged in a plurality of arrays; the photosensitive wavelengths of each pixel unit in each array are different.

Figure 5:
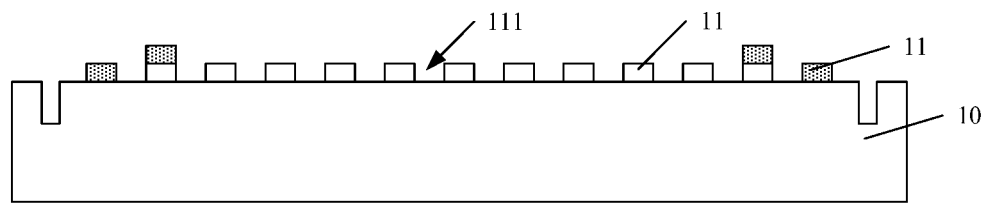
FIG. 5 is a schematic diagram of providing a front-end structure according to an embodiment of the present disclosure

For the step S1, as shown in FIG. 5, the front-end structure 10 may include, for example, a substrate preparation process, wherein a sensor layer is provided, is used for carrying out photoelectric conversion; a photosensitive element (a photoelectric conversion component) is arranged in the sensor layer and is used for converting incident light into electrons through photons to form electric signals. A metal interconnect 11 can be further formed on the substrate and used for transmitting the photoelectric converted electric signals of the sensor layer to the peripheral circuit for processing. The edge of the front-end structure 10 can also be provided with a pad region for use as a subsequent packaging and wire bonding. The front-end structure can be prepared according to the prior art, which is not specifically described in the present disclosure.

Figure 6:
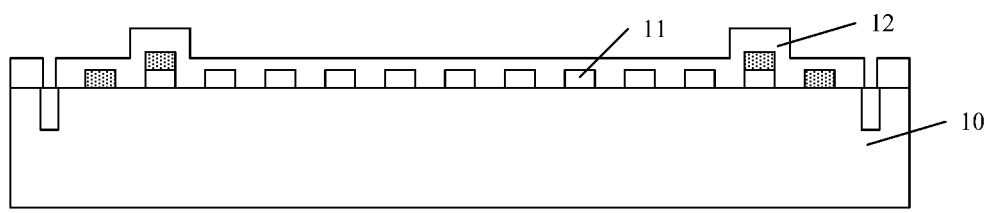
FIG. 6 is a schematic view of forming a first material layer according to an embodiment of the present disclosure

For the step S2, please refer to FIG. 6-FIG. 9 to illustrate the form of a plurality of pixel units of A-A' in FIG. 4 for description. The method can comprise the following steps:

Firstly, step S21 is performed, as shown in FIG. 6, a first material layer 12 is coated on the front-end structure 10, to cover a metal interconnect 11 on the front-end structure 10.

The first material layer 12 can be an organic material layer, such as a resin. The first material layer 12 can be formed by spin coating equipment and baked to be fixed.

Figure 7:
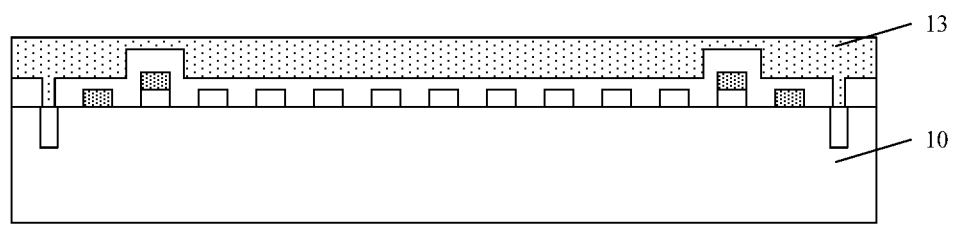
FIG. 7-FIG. 8 are schematic diagrams of forming a first pixel unit according to an embodiment of the present disclosure

Then, the step S22 is carried out, a first photosensitive material layer 13 is coated on the first material layer 12, and a first pixel unit 131 is formed by photolith. As shown in FIG. 7, a first photosensitive material layer 13 is formed by adopting a spin coating device, and the first photosensitive material layer 13 has a first photosensitive wavelength, the photosensitive material layer 13 covers the whole front-end structure 10, the excess parts can be removed by developing.

Figure 8:
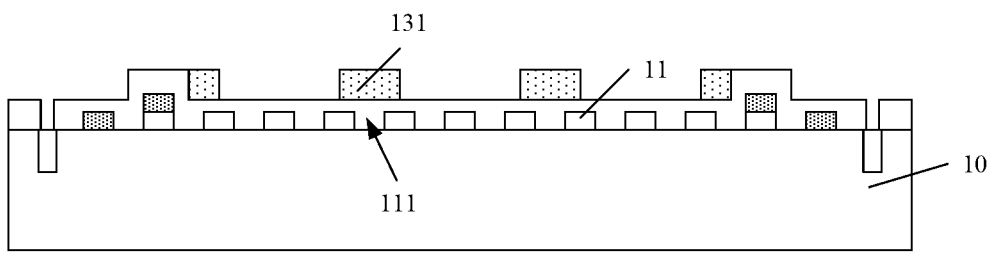

In an embodiment of the present disclosure, a pixel unit is formed over a metal interconnect 11 of an intermediate portion, namely, a pixel unit is not formed on the metal interconnect 11 which is filled with the two sides in the figure. As shown in FIG. 8, the first pixel unit 131 is formed by developing and baking, so that the first pixel unit 131 is formed in the step is formed above the light-transmitting region 111 between the adjacent metal interconnects 11, so that light transmission is achieved.

Figure 9:
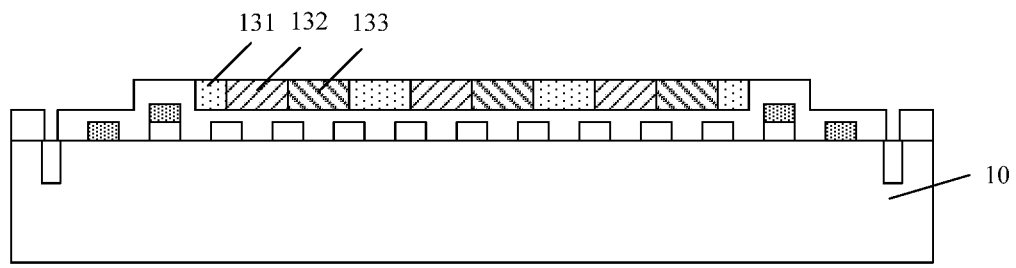
FIG. 9 is a schematic diagram of forming a $k^{th}$ pixel unit according to an embodiment of the present disclosure

Then, the step S23 is carried out, a $k^{th}$ photosensitive material layer is coated on the first material layer 12, a $k^{th}$ pixel unit is formed by photolith, and K is larger than 1 and smaller than N; such as shown in FIG. 9, a second pixel unit 132 and a third pixel unit 133 can be formed, and the process is basically consistent with that in the step S22, those skilled in the art can clearly know how to form the second pixel unit 132 and the third pixel unit 133 on the basis of the context and the FIG. 7-FIG. 9. As can be seen from FIG. 9, the first pixel unit 131, the second pixel unit 132 and the third pixel unit 133 are sequentially arranged, so that the arrangement relation shown in FIG. 4 is formed. Further, for example, with the nine-pixel units as shown in FIG. 4, reference can be made to the top view shown in FIG. 10, and continuing to complete the fourth pixel unit 134 and the other pixel unit 135-138 (not shown in in the figure) is prepared. The $k^{th}$ photosensitive material layer has the $k^{th}$ photosensitive wavelength, which simply means that each photosensitive material layer has a different photosensitive wavelength.

Then, the step S23 is carried out, an $N^{th}$ photosensitive material layer is coated on the first material layer, and an $N^{th}$ pixel unit is formed through photolith; in the step, as shown in FIG. 4, it is known that N is equal to 9; similarly, forming of the nine-pixel unit is consistent with the formation of other pixel units, and the reference can be made to the description above.

Similarly, the photosensitive wavelength of the $N^{th}$ photosensitive material layer is also different from that of any previous photosensitive material.

Figure 10:
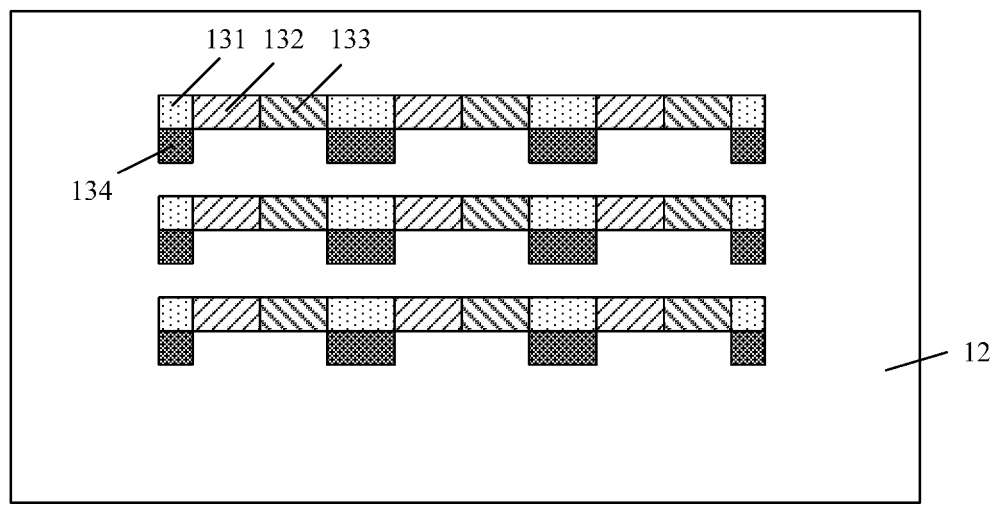
FIG. 10 is a top view of forming a $k^{th}$ pixel unit according to an embodiment of the present disclosure

Further, as can be seen in conjunction with FIG. 4 and FIG. 10, each pixel unit is different from its adjacent pixel unit. In one embodiment, the first pixel unit 131 to the $N^{th}$ pixel unit (for example, the $9^{th}$ pixel unit 139) are sequentially arranged in an array, that is, each array includes the same number of pixel units. According to different requirements, some arrays can also have other numbers of pixel units. For example, each array may be a 3*3 array and may also be an array of other sizes. It will be appreciated that these arrays can also have differences, such as including the 3*3 arrays and the 6*3 arrays and the like. In the embodiment of FIG. 4, the arrays are uniformly distributed, so that not only processing is facilitated, but also the spectral detection is facilitated.

In the step S2, the photosensitive half-wavelength width range of the first photosensitive material layer to the $N^{th}$ photosensitive material layer is from $\lambda_i/2-20$ nm to $\lambda_i/2+20$ nm, wherein $\lambda_i$ is the set photosensitive wavelength of the $i^{th}$ photosensitive material layer, 1≤i≤N. The photosensitive wavelength of the first photosensitive material layer and the photosensitive wavelength of the $N^{th}$ photosensitive material layer are sequentially increased, the use of such photosensitive materials facilitates production and post-processing. For example, the range of $\lambda_i$ may be 10 nm to 2000 nm, such as, for a 3*3 array having 9 pixel units, the photosensitive wavelength of the photosensitive material for preparing each pixel unit can be 450 nm, 500 nm, 550 nm, 600 nm, 660 nm, 730 nm, 800 nm, 850 nm, and 950 nm respectively. Certainly, it can also select photosensitive material with the photosensitive wavelength larger than 2000 nm or less than 10 nm.

Figure 11:
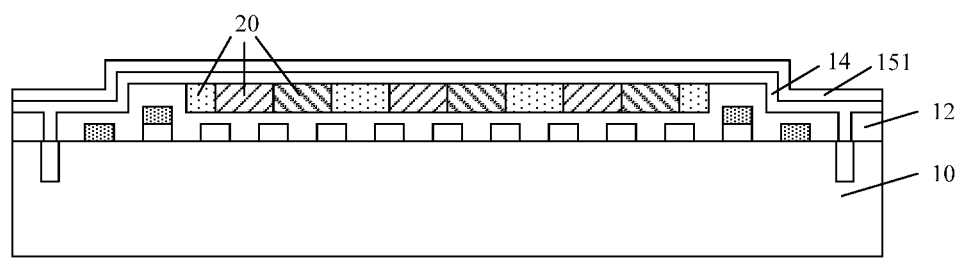
FIG. 11 is a schematic view of forming a second material layer and a lens material layer according to an embodiment of the present disclosure

Then, referring to FIG. 11, the method further comprises the following steps:

a second material layer 14 is formed to cover the pixel layer 20 and the first material layer 12; the second material layer 14 can be made of organic materials such as resin and the like.

Forming a lens material layer 151 on the second material layer 14 which is on a region of the pixel layer 20.

Figure 12:
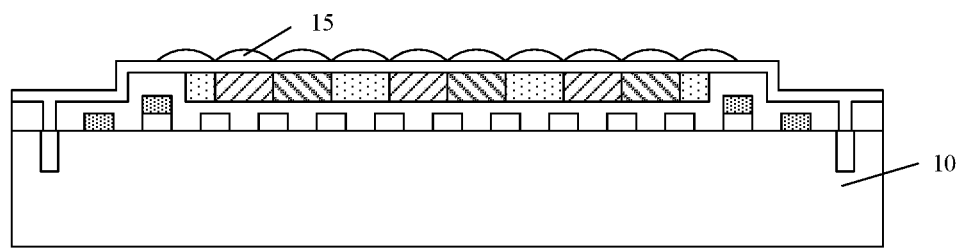
FIG. 12 is a schematic view of forming a micro-lens layer according to an embodiment of the present disclosure

As shown in FIG. 12, the lens material layer is formed into a micro-lens layer 15 through a photolith process, and can be completed through processes including exposure, development, heat reflux, baking and the like; in other words, the process can be carried out in the prior art.

A third material layer (not shown) is formed to cover the micro-lens layer 15 and the second material layer 14, and the third material layer can be made of organic materials such as resin and the like.

Figure 13:
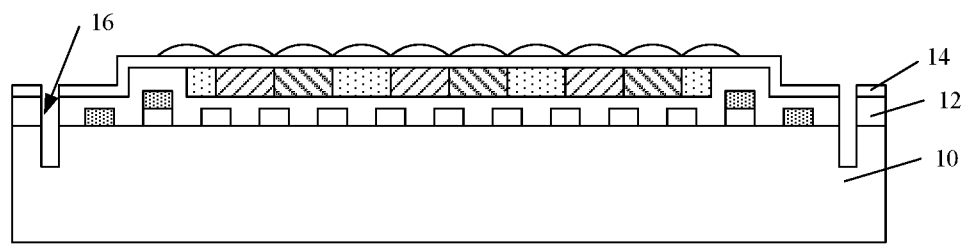
FIG. 13 is a schematic view of forming a bonding pad region according to an embodiment of the present disclosure

As shown in FIG. 13, the edge part region of the front-end structure 10 is exposed through photolith and etching processes to form a bonding pad region. An opening 16 is formed, and an original through hole in the front-end structure 10 is exposed so as to facilitate packaging and wire bonding.

Then, the third material layer is removed, such as by etching and cleaning, the multispectral image sensor mentioned above can be obtained.

In conclusion, the multi-spectral image sensor and the manufacturing method thereof in the present disclosure have the following advantages compared with the prior art:

①. High Expandability

By adopting the multi-spectral image sensor and the manufacturing method thereof, the multi-spectral image sensor is not limited to an optical filter switching unit, a plurality of photosensitive materials with different wavelengths can be arranged according to requirements, so that the detection of hundreds or even more of the spectrums can be realized.

②. Fast and Efficient

By adopting the multi-spectral image sensor and the manufacturing method thereof, the multi-spectral image sensor can be compatible with dozens of hundreds or even more of spectrums, and multispectrals can be detected at the same time without switching the optical filter. In the assembly line detection operation, the speed of the assembly line can be increased, and the practical application efficiency can be greatly improved.

③. Small in Size and Low in Cost

According to the spectrum detection device, an optical filter switching unit can be omitted, so that the size of the overall spectrum detection device is reduced, and the cost is reduced.

④. Wide Application Range

The multi-spectral image sensor and the manufacturing method thereof can be compatible with dozens of hundreds or even more of spectrums and can be applied to various occasions. And in some occasions, such as a small closed space, the optical filter switching unit is difficult to be accommodated in the small closed space, the spectrum detection device provided by the present disclosure has the characteristics of being small and capable of being suitable for such occasions.

While the present disclosure has been particularly shown and described with references to preferred embodiments thereof, it will be understood by those skilled in the art that various changes in form and details may be made therein without departing from the spirit and scope of the present disclosure as defined by the appended claims.

What is claimed is:

1. A method for manufacturing a multi-spectral image sensor, comprises:
   providing a front-end structure for performing photoelectric conversion and processing;
   forming a pixel layer on the front-end structure, wherein, the pixel layer has N pixel units, N≥4, the pixel units are arranged in a plurality of arrays, the photosensitive wavelengths of each pixel unit in each array are different;
   wherein the step of forming the pixel layer on the front-end structure comprises:
   coating a first material layer on the front-end structure, to cover a metal interconnect on the front-end structure;
   sequentially forming a first pixel unit to an $N^{th}$ pixel unit of the N pixel units on the first material layer;
   wherein the step of forming the first pixel unit comprises coating a first photosensitive material layer on the first material layer, and forming the first pixel unit through photolithography;
   wherein the step of forming a $k^{th}$ pixel unit of the N pixel units comprises coating a $k^{th}$ photosensitive material layer on the first material layer, and forming the $k^{th}$ pixel unit through photolithography;
   wherein the step of forming the $N^{th}$ pixel unit comprises coating an $N^{th}$ photosensitive material layer on the first material layer, and forming the $N^{th}$ pixel unit through photolithography;
   wherein the photosensitive wavelength of the first photosensitive material layer to the photosensitive wavelength of the $N^{th}$ photosensitive material layer are sequentially increased;
   wherein all the pixel units are formed within a same layer directly on the first material layer and each pixel unit is different from its adjacent pixel unit, and 1<k<N.

2. The manufacturing method of claim 1, wherein the first pixel unit to the $N^{th}$ pixel unit are sequentially arranged in an array.

3. The manufacturing method of claim 2, wherein the photosensitive half-wavelength width range of the first photosensitive material layer to the $N^{th}$ photosensitive material layer is:
   from $\lambda_i/2-20$ nm to $\lambda_i/2+20$ nm, wherein $\lambda_i$ is the set photosensitive wavelength of the $i^{th}$ photosensitive material layer, and 1≤i≤N.

4. The manufacturing method of claim 1, wherein each pixel unit is formed between adjacent metal interconnects.

5. The manufacturing method of claim 1, wherein, after the pixel layer is formed on the front-end structure, the method further comprises:
   forming a second material layer to cover the pixel layer and the first material layer;

forming a lens material layer on the second material layer which is on a region of the pixel layer; forming the lens material layer into a micro-lens layer through a photo-lithography process;

forming a third material layer to cover the micro-lens layer and the second material layer;

exposing the edge region of the front-end structure through photolithography and etching processes, to form a bonding pad region; and removing the third material layer.

* * * * *